United States Patent
Kobayashi

(10) Patent No.: US 6,590,796 B2
(45) Date of Patent: Jul. 8, 2003

(54) SEMICONDUCTOR MEMORY DEVICE WITH VARIABLY SET DATA INPUT-OUTPUT TERMINALS AND CONTROL SIGNAL TERMINALS FOR THE SAME

(75) Inventor: Hiroyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/084,929

(22) Filed: Mar. 1, 2002

(65) Prior Publication Data

US 2003/0012044 A1 Jan. 16, 2003

(30) Foreign Application Priority Data

Jul. 10, 2001 (JP) .................................. 2001-209940

(51) Int. Cl.[7] ................................................ G11C 7/00
(52) U.S. Cl. ...................... 365/63; 365/189.05; 365/193
(58) Field of Search ............................... 365/63, 189.05, 365/193, 230.08

(56) References Cited

U.S. PATENT DOCUMENTS 5,332,922 A * 7/1994 Oguchi et al. .............. 257/723
5,818,792 A * 10/1998 Sasaki et al. ............ 365/230.08

* cited by examiner

Primary Examiner—Vu A Le
(74) Attorney, Agent, or Firm—Arent Fox Kintner Plotkin & Kahn, PLLC

(57) ABSTRACT

A memory circuit comprises M (M is a plurality) data input (or output) terminal groups I, II, each of which has N (N is a plurality, e.g., 8 bits) data input (or output) terminals DQ, with M control signal terminals STB, MSK for the data input (or output) being provided for each data input (or output) terminal group, wherein this circuit has at least 8 controlled circuits IO-BUF, WA for the data input (or output) signals in each data input (or output) terminal group, and control signal supply wirings 12, 22 each of which supplies intra-group control signal to these 8 controlled circuits. In accordance with a data configuration control signal L4, L8, L16 that controls the use or non-use of the data input (or output) terminals, the memory circuit is controlled to a first data input (or output) configuration.

19 Claims, 12 Drawing Sheets

SECOND EMBODIMENT (X8)

SEMICONDUCTOR MEMORY DEVICE WITH VARIABLY SET DATA INPUT-OUTPUT TERMINALS AND CONTROL SIGNAL TERMINALS FOR THE SAME

BACKGROUND OF THE INVENTION

1. Field of the Invention

The present invention relates to a semiconductor memory device which has variably set data input-output terminals and control signal terminals for the same, in which there is a common supply of control signals regardless of the byte configuration of the data input-output terminals, so that variation in the data input-output timing and variation in the data mask timing according to the byte configuration is prevented.

2. Description of the Related Art

In semiconductor memory devices, there has been a proliferation of devices of various types with different memory cell structures, such as DRAM, SRAM, flash memories, ferroelectric memories and the like. These memory devices have different memory cell structures; however, addresses, data and commands such as read-write commands and the like are supplied from the outside, read data is output at a specified timing, and write data is similarly input.

Memory devices must have a configuration which can handle various types of data input-output terminal configurations such as a 4-bit configuration, 8-bit configuration, 16-bit configuration or the like in accordance with the configuration of the system in which the memory device is mounted. On the other hand, the design and production of separate memory devices for a plurality of different types of input-output bit configurations results in an increase in cost. Accordingly, such a cost increase is prevented by suing a common memory circuit, a common chip and a common package, and arranging the system to a plurality of different types of memory devices so that used and unused pins or used and unused data input-output terminals can be altered in accordance with the input-output bit configuration.

FIGS. 1, 2 and 3 are diagrams which illustrate the configurations of conventional memory devices. FIG. 1 shows a memory device in which the data input-output terminals have a 2-byte or 16-bit configuration, FIG. 2 shows a memory device in which the data input-output terminals have a 1-byte or 8-bit configuration, and FIG. 3 shows a memory device in which the data input-output terminals have a ½-byte or 4-bit configuration. One of these memory devices is selected in accordance with the system in which the memory device is mounted.

In the figures, a chip 1 on which a memory circuit is formed is mounted in a package 2. In order to handle the three types of memory devices described above, the chip 1 has 16 data input-output terminals DQ0 to DQ7 and DQ8 to DQ15, and input-output buffers IO-BUF0 to IO-BUF15 that correspond to these data input-output terminals, and the package 2 has external pins P0 to P15. Furthermore, the chip 1 has strobe signal terminals STB0 and STB1 that control the data input-output timing, and corresponding input-output buffers IO-BUFS0 and IO-BUFS1 for each of the 8-bit (1-byte) data input-output terminal groups DQ0 to DQ7 and DQ8 to DQ15, and the package 2 also has corresponding external pins PS0 and PS1. Furthermore, the chip 1 has mask signal terminals MSK0 and MSK1 used to prohibit data input-output for each of the 8-bit (1-byte) data input-output terminal groups DQ0 to DQ7 and DQ8 to DQ15, and the package 2 also has corresponding external pins PS0 and PS1. The terminals of the chip and the external terminals of the package are connected by bonding wires 3.

In computer systems in which memory devices are mounted, data is generally processed in word units (1 byte or 8 bits). Accordingly, memory devices are also correspondingly constructed so that the timing control signals are utilized in respective data input-output terminal groups consisting of word units (1 byte or 8 bits).

In the case of the 16-bit configuration shown in FIG. 1, a strobe signal terminal STB0 and a mask signal terminal MSK0 are provided for the first data input-output terminal group DQ0 to DQ7, and a strobe signal terminal STB1 and mask signal terminal MSK1 are provided for the second data input-output terminal group DQ8 to DQ15. To describe the strobe signals STB0 and STB1, switches SW0 and SW1 are installed in strobe signal supply lines 10 and 20 that supply strobe signals to the respective data input-output buffers inside the chip 1; here, the switch SW0 is controlled to a conductive state, while the switch SW1 is controlled to a non-conductive state. As a result, the first strobe signal STB0 is supplied to the first data input-output buffer group IO-BUF0 to IO-BUF7, and the second strobe signal STB1 is supplied to the second data input-output buffer group IO-BUF8 to IO-BUF15. These switches are controlled by set signals L4, L8 and L16 generated by a latching circuit 4 which latches that data input-output terminal configuration.

Furthermore, the first mask signal MSK0 controls the writing operation of the write amplifier WA0–WA7 corresponding to the first data input-output signals DQ0 to DQ7, and the second mask signal MSK1 controls the writing operation of the write amplifier WA8–WA15 corresponding to the second data input-output signals DQ8 to DQ15.

Thus, strobe signals and mask signals are provided for each of the 8-bit data input-output terminal groups, so that the input-output buffers and write amplifiers of the respective subordinate data input-output terminal groups are controlled.

In the case of the 8-bit configuration shown in FIG. 2, as is indicated by the bonding wires 3, only the four bits DQ0, DQ2, DQ5 and DQ7 are used from the first data input-output terminal groups DQ0 to DQ7, and only the four bits DQ8, DQ10, DQ13 and DQ15 are used from the second data input-output terminal group DQ8 to DQ15. The other data input-output terminals are in an unused state, and the corresponding external pins P1, P3, P4, P6 and P9, P11, P12, P14 of the package are designated as NC pins. In this case, in accordance with the approach that control signals control each 8-bit data input-output terminal group, the first strobe signal terminal STB0 and the first mask signal terminal MSK0 are in an unused state, so that only the second strobe signal terminal STB1 and second mask signal terminal MSK1 are in a used state, and the second strobe signal STB1 and second mask signal terminal MSK1 are supplied to the input-output buffer circuits and write amplifier corresponding to the used 8-bit data input-output terminal group.

To describe the strobe signals, a first switch SW0 in the strobe signal supply lines 10 and 20 is controlled to a non-conductive state, while a second switch SW1 is controlled to a conductive state, so that the second strobe signal STB1 is supplied to the eight input-output buffer circuits IO-BUF that are in use. The mask signal MSK1 is also supplied to the write amplifiers WA0 to WA7 and WA8 to WA15 on both sides by a similar switching circuit.

In the case of the 4-bit configuration shown in FIG. 3, as is indicated by the bonding wires 3, only the two bits DQ2 and DQ5 are used from the first data input-output terminal group DQ0 to DQ7, and only the two bits DQ10 and DQ13 are used from the second data input-output terminal group DQ8 to DQ15. The other data input-output terminals are in an unused state. Furthermore, the first strobe signal terminal STB0 and mask signal terminal MSK0 are also in an unused state, so that the second strobe signal STB1 and mask signal MSK1 are supplied in common to the input-output buffer circuits and write amplifier corresponding to the data input-output signals of the abovementioned four bits.

Thus, switching is performed in accordance with the data input-output terminal configuration so that control signals such as strobe signals, mask signals and the like for the data input-output signals are used in common for data input-output signals in word units (8-bit units). As a result, the circuit corresponding to the first data input-output terminal group DQ0 to DQ7 is controlled by the first strobe signal STB0 and mask signal MSK0 belonging to this group in the case of a 16-bit configuration, but is controlled by the second strobe signal STB1 and mask signal MSK1 belonging to another group in the case of an 8-bit configuration or 4-bit configuration.

Accordingly, in the case of the 16-bit configuration, the strobe signal supply lines 10 and 20 are the same in the first and second data input-output terminal groups, so that the wiring length to the input-output buffer circuits corresponding to the respective terminal groups is relatively short.

However, in the case of the 8-bit configuration or 4-bit configuration, the second strobe signal STB1 belonging to the adjacent group is supplied to the first data input-output buffer group IO-BUF0-7. As a result, the length of the wiring that supplies the strobe signal STB1 to the first data input-output buffer group IO-BUF0-7 is longer than the length of the wiring that supplies this strobe signal to the second data input-output buffer group IO-BUF8-15.

Accordingly, skewing is generated in the input-output timing between the first data input-output signal group DQ0–DQ7 and the second data input-output signal group DQ8–DQ15. In cases where the memory device operates using strobe signals with a relatively low frequency, the occurrence of such skewing does not lead to erroneous operation; however, in the case of high-speed memory devices which operate using high-frequency strobe signals, there is a possibility that such skewing will cause erroneous operation.

The same problem occurs in the case of the mask signals. Specifically, in the case of an 8-bit configuration or 4-bit configuration, the length of the wiring supplying the mask signals becomes non-uniform, so that skewing occurs in the mask signals sent to the respective write amplifiers. When the operating cycle of the memory device is short, there is no margin in the timing at which masking is to be performed by the mask signals; accordingly, skewing of the abovementioned mask signals leads to erroneous operation.

Furthermore, in conventional constructions, switching circuits are installed in the supply wiring of the strobe signals and mask signals; accordingly, the wiring structure is complicated. Moreover, since the strobe signal terminals and mask signal terminals may be in an unused state depending on the type of product, the memory controller must control the supply or non-supply of these control signals in accordance with the type of product involved, so that control becomes complicated.

SUMMARY OF THE INVENTION

Accordingly, it is an object of the present invention to provide a semiconductor memory device that can prevent variation in the operational timing caused by skewing of the control signals that control the data input-output signals.

Furthermore, another object of the present invention is to provide a semiconductor memory device in which the configuration relating to control signals that control the data input-output signals is devised as common as possible in different types of products.

In order to achieve the abovementioned objects, one aspect of the present invention is a memory circuit comprising M (M is a plurality) data input (or output) terminal groups, each of which has N (N is a plurality, e.g., 8 bits) data input (or output) terminals, with control signal terminals for the data input (or output) being provided for each data input (or output) terminal group, wherein this circuit has at least N controlled circuits for the data input (or output) signals in each data input (or output) terminal group, and control signal supply wirings each of which supplies intra-group control signal to these N controlled circuits. In accordance with a data configuration control signal that controls the use or non-use of the data input (or output) terminals, the memory circuit is controlled to a first data input (or output) configuration in which a controlled data unit with a specified number of bits is constructed by a single data input (or output) terminal group, or a second data input (or output) configuration in which the controlled data unit is constructed by a plurality of data input (or output) terminal groups. Furthermore, control signals belonging to the respective data input (or output) terminal groups are supplied to (or utilized in) the controlled circuits of these data input (or output) terminal groups regardless of whether the configuration used is the first or second data input (or output) configuration.

Accordingly, in cases where the controlled data unit straddles a plurality of data input (or output) terminal groups as in the second data input (or output) configuration, the controlled circuits of the plurality of data input (or output) terminal groups are controlled by a plurality of control signals respectively. Of course, in cases where the controlled data unit is constructed within a single data input (or output) terminal group as in the first data input (or output) configuration, a plurality of controlled circuits for the controlled data unit are controlled by a single control signal.

In a preferred embodiment, the control signals are strobe signals that control the timing of data input (or output), and the controlled circuits are data input (or output) buffers.

Furthermore, in another preferred embodiment, the control signals are mask signals that prohibit a writing operation by invalidating write data, and the controlled circuits are write circuits.

Furthermore, in another preferred embodiment, the control signals are mask information signals that designate cycles in which write data is invalid, and mask signals are formed from these mask information signals. Moreover, the controlled circuits are write circuits, e.g., write amplifiers.

DESCRIPTION OF THE PREFERRED EMBODIMENTS

Embodiments of the present invention will be described below with reference to the attached figures. However, the protected scope of the present invention is not limited to the following embodiments, but extends to the inventions described in the claims, and equivalents of the same.

Figure 1:
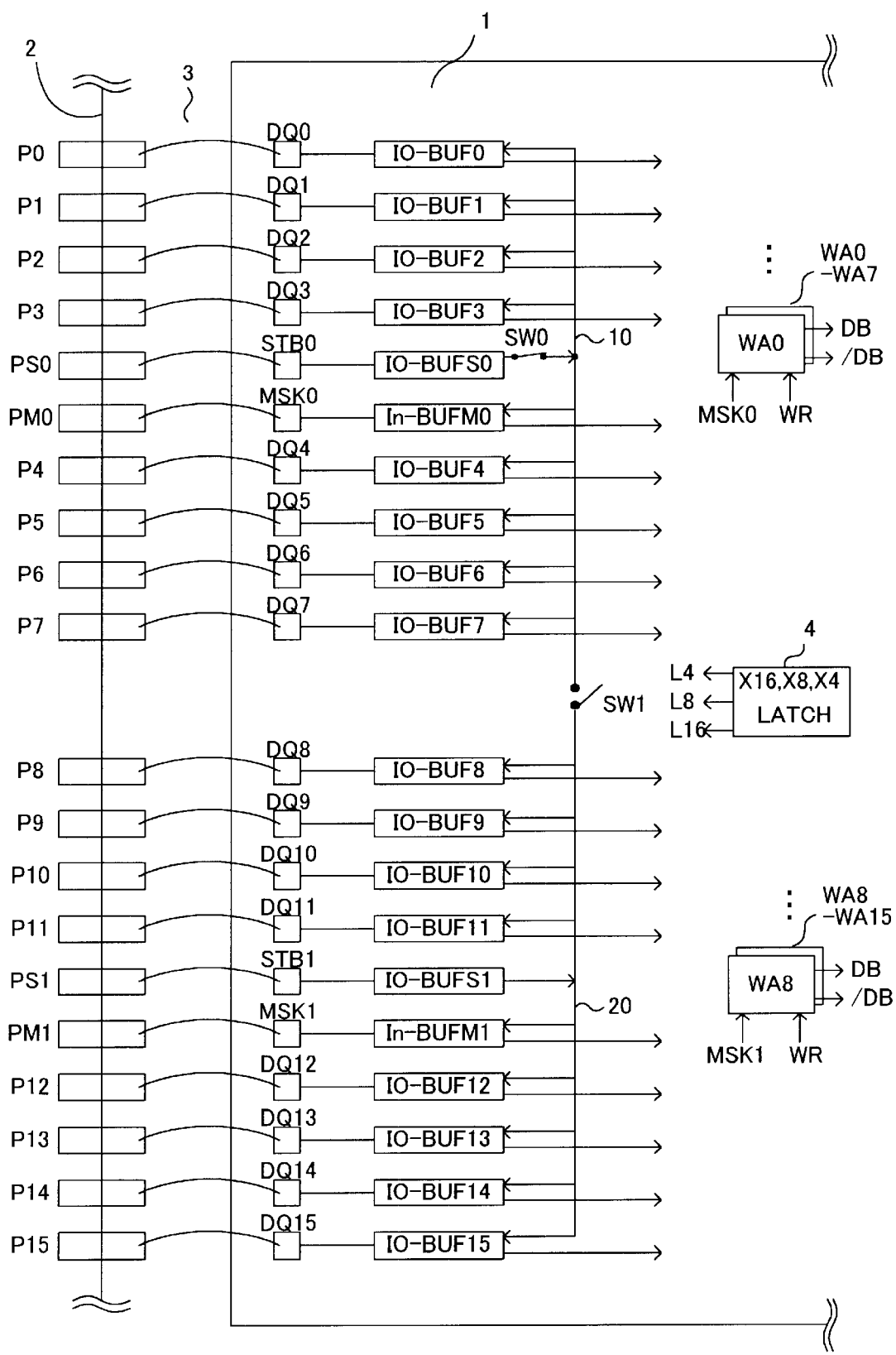
FIG. 1 is a diagram which illustrates a conventional memory device.
Figure 2:
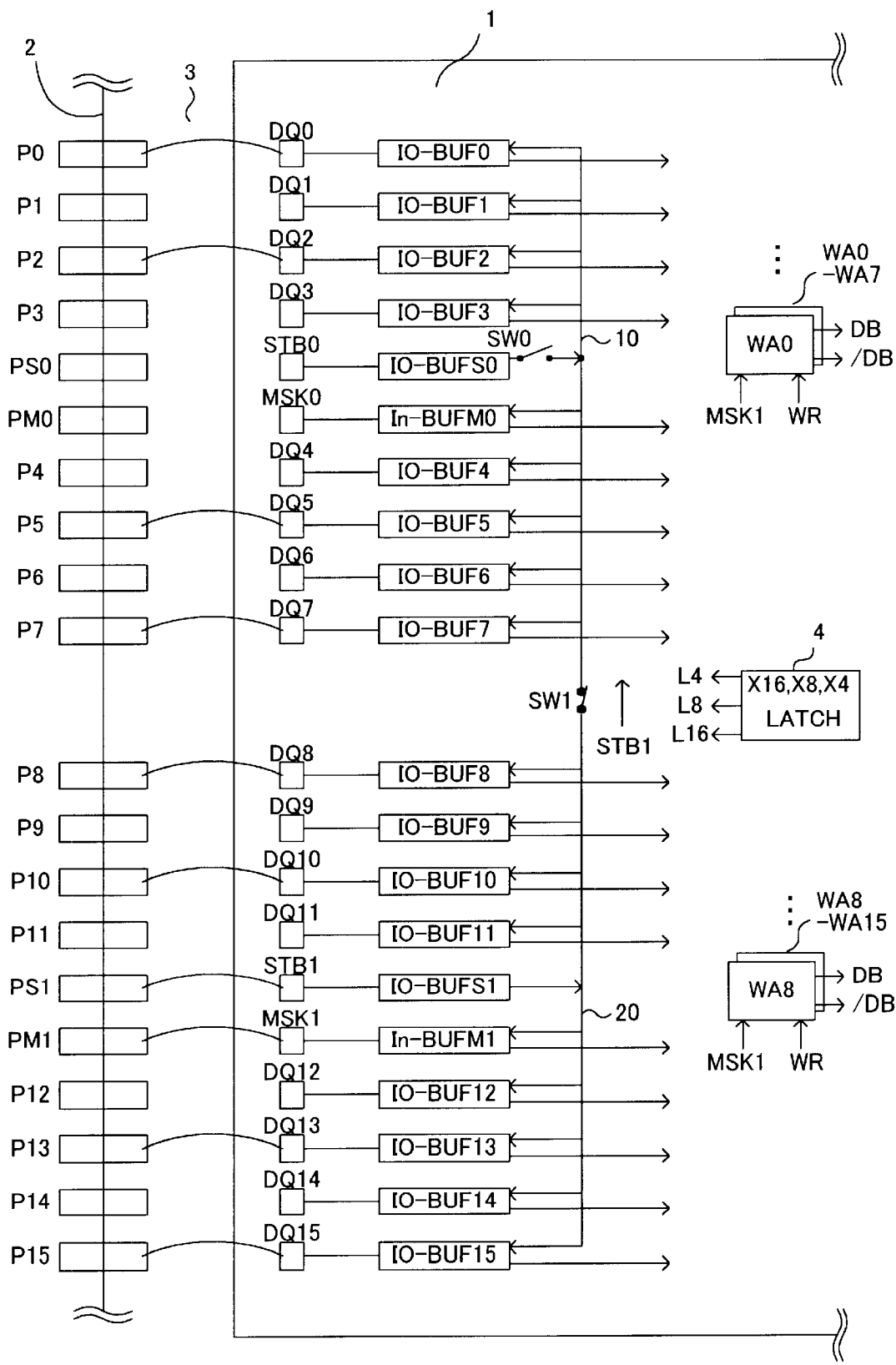
FIG. 2 is a diagram which illustrates a conventional memory device.
Figure 3:
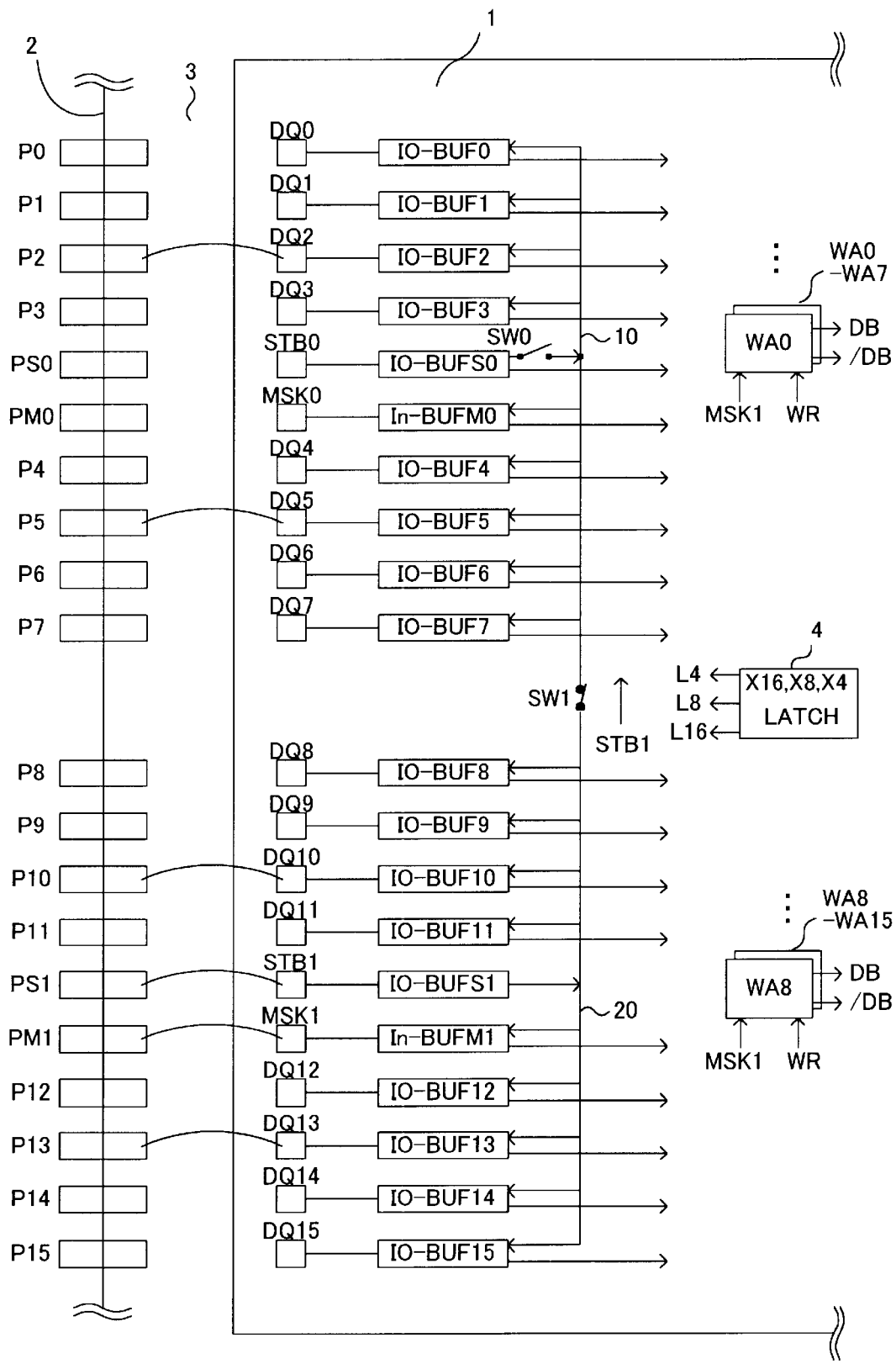
FIG. 3 is a diagram which illustrates a conventional memory device.
Figure 4:
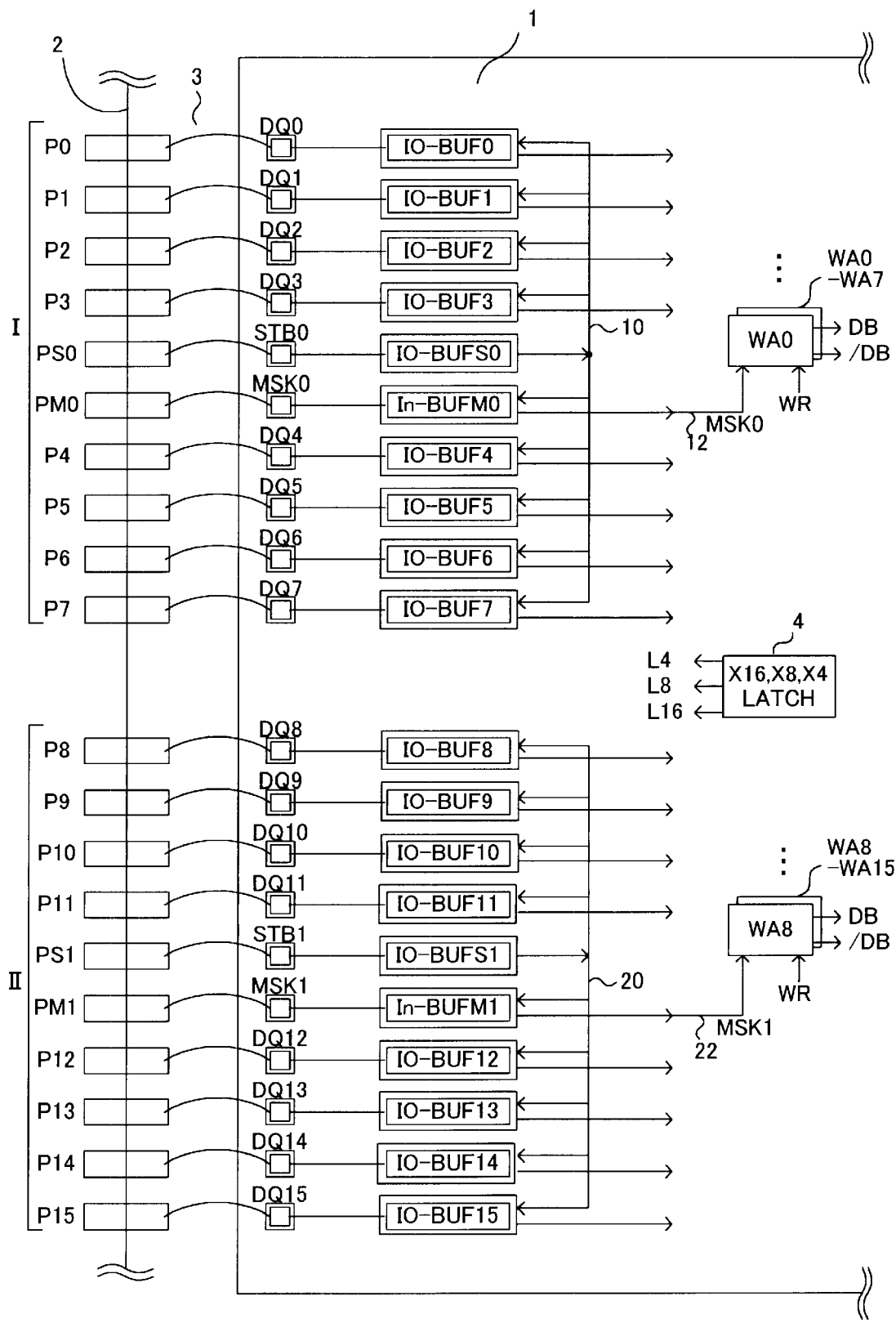
FIG. 4 is a diagram which illustrates the construction of a memory device in a first embodiment of the present invention.
Figure 5:
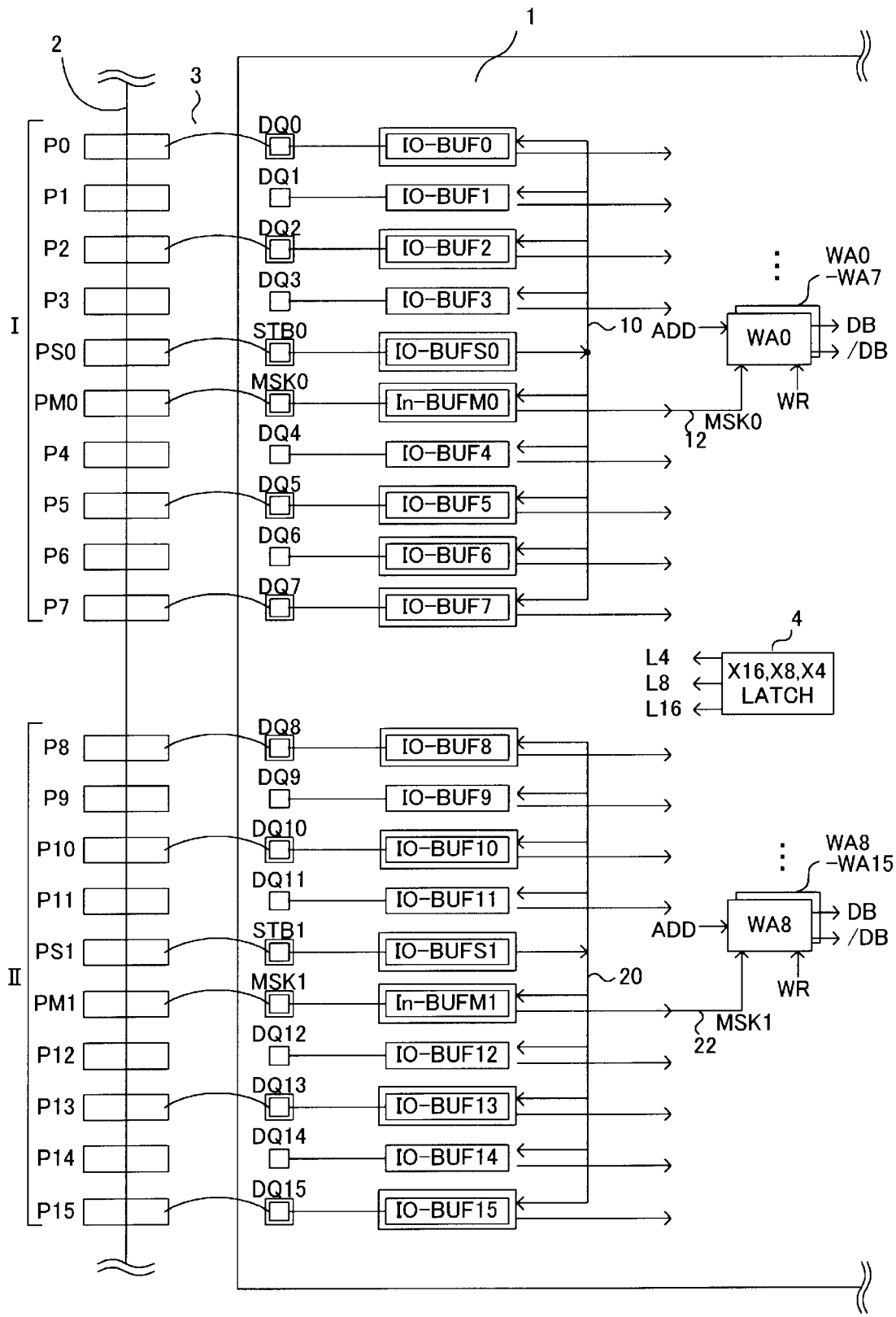
FIG. 5 is a diagram which illustrates the construction of a memory device in a first embodiment of the present invention.
Figure 6:
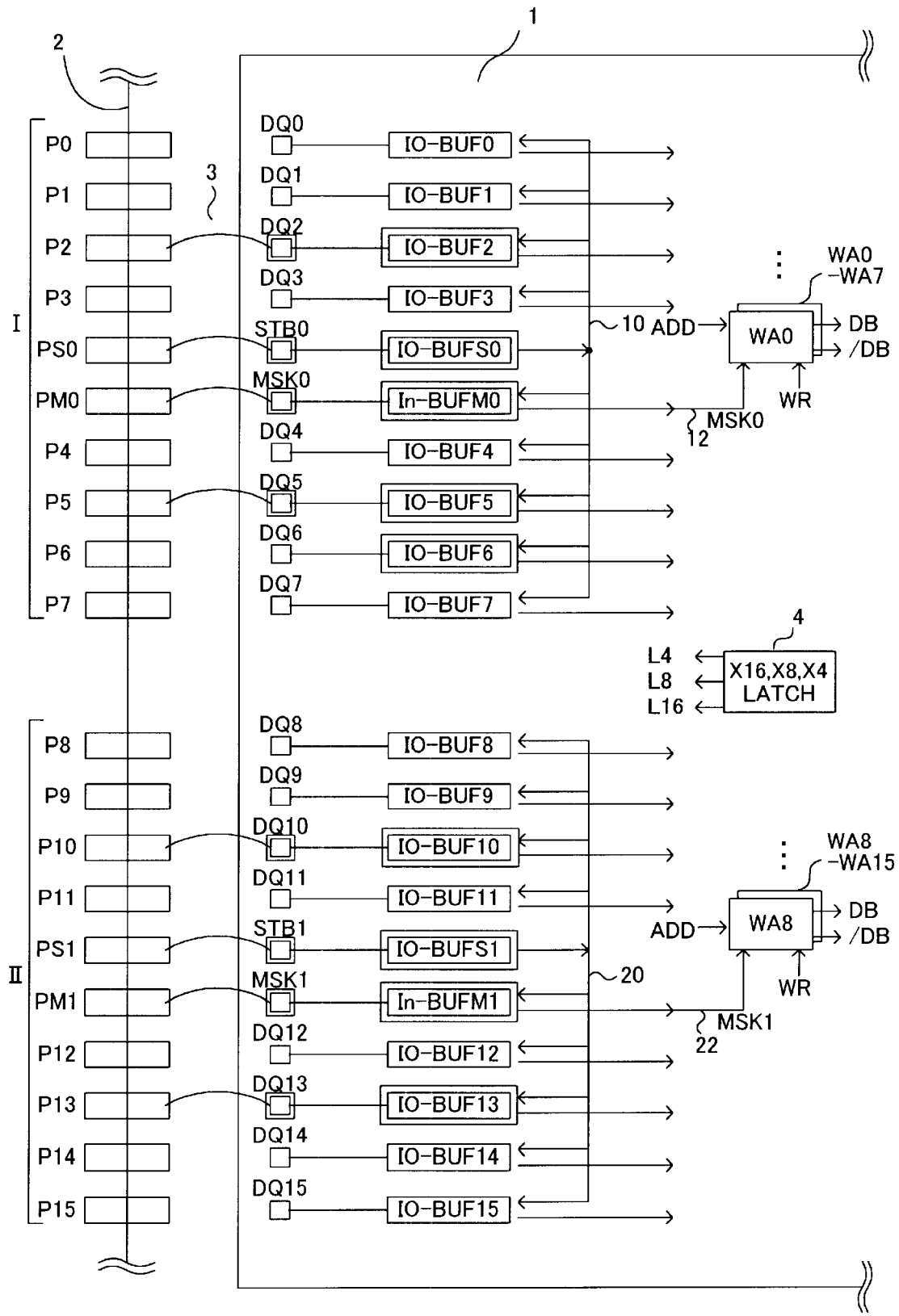
FIG. 6 is a diagram which illustrates the construction of a memory device in a first embodiment of the present invention.

FIGS. 4, 5 and 6 are structural diagrams of a memory circuit in a first embodiment of the present invention. Parts that are the same as in FIGS. 1 through 3 showing conventional examples are labeled with the same reference numbers. In the present embodiment as well, the chip 1 on which the memory circuit is formed, and the package 2 that accommodates this chip 1, have a common configuration that can handle three different types of memory circuits; the data input-output terminals that are used and the corresponding circuits are selected in accordance with the type of memory circuit.

FIG. 4 shows a memory device which has a 16-bit data input-output configuration, FIG. 5 shows a memory device which has an 8-bit data input-output configuration, and FIG. 6 shows a memory device which has a 4-bit data input-output configuration. Referring to FIG. 4, the chip 1 has two data input-output terminal groups I and II, each of which has 8 data input-output terminals DQ0 to DQ7 or DQ8 to DQ15, and two corresponding data input-output buffer groups, each of which has 8 input-output buffers IO-BUF0 to IO-BUF7 or IO-BUF8 to IO-BUF15. Furthermore, although this is not shown in FIG. 4, write amplifiers WA0 to WA7 and WA8 to WA15 respectively corresponding to the two data input-output terminals groups I and II are also provided.

A strobe signal terminal STB0 and a mask signal terminal MSK0 are provided for the first data input-output terminal group DQ0 to DQ7 as control signals belonging to this group, so that the data input-output buffers IO-BUF0 to IO-BUF7 and write amplifiers WA0 to WA7 belonging to the first group are respectively controlled in a dedicated manner by this strobe signal terminal STB0 and mask signal terminal MSK0.

Furthermore, a strobe signal terminal STB1 and mask signal terminal MSK1 are also provided for the second data input-output terminal group DQ8 to DQ15 as control signals belonging to this group, so that the data input-output buffers IO-BUF8 to IO-BUF15 and write amplifiers WA8 to WA15 belonging to the second group are respectively controlled in a dedicated manner by this strobe signal terminal STB1 and mask signal terminal MSK1.

Here, the strobe signals STB are strobe signals that are used to control the data input timing or output timing. In cases where the input timing is controlled, the write data supplied to the data input-output terminals is input into the data input-output buffers in synchronized with a strobe signal supplied from the external memory controller. Accordingly, the strobe signal STB is supplied to the respective data input buffers.

Furthermore, in cases where the output timing is controlled, the read data is output from the data input-output buffers in synchronized with a strobe signal supplied from the external memory controller or a strobe signal output by the memory circuit itself. Accordingly, the strobe signal STB output by the memory circuit is only output to the outside at the same timing at which data is output from the data output buffers; this strobe signal STB is not supplied to the data output buffers.

In the case of an operation in which a plurality of sets of data are continuously written, as in burst writing or the like, the mask signals are control signals that invalidate the data of specified cycles and thus prevent the writing of this data. When the mask signals are at the activation level, the writing operation of the write amplifiers WA that form a part of the write circuit is prohibited. Writing may also be prohibited in another part of the write circuit than the write amplifiers. In the example shown in FIG. 4, mask signals MSK0 and MSK1 are supplied to the write amplifiers WA in addition to internal write amplifier control signals WR. The write amplifiers WA are activated in synchronization with the write amplifier control signals WR; however, when the mask signals MSK0 and MSK1 are at the activation level, the activation of the write amplifiers is prohibited.

Furthermore, in the case of an operation in which a plurality of sets of data are continuously read as in burst reading or the like, the mask signals are signals that prohibit the output of data of specified cycles. In such cases, the output of read data is prohibited in the sense buffers (not shown in the figures) or data input-output buffers that form a part of the read circuit when the mask signals are at the activation level.

As is shown in FIG. 4, the strobe signals STB0 and STB1 that constitute control signals are separately supplied to the data input-output buffers IO-BUF0 to IO-BUF7 and IO-BUF8 to IO-BUF15 in the respective groups to which the strobe signals belong, from the strobe signal input buffers IO-BUFS0 and IO-BUFS1, via the strobe signal supply lines 10 and 20. Similarly, the mask signals MSK0 and MSK1 are also separately supplied to the write amplifiers WA0 to WA7 and WA8 to WA15 in the respective groups to which the mask signals belong, from the mask signal input buffers IO-BUFM0 and IO-BUFM1, via the supply lines 12 and 22. Furthermore, the construction of the write amplifiers will be described in detail later.

Thus, the control signal supply lines 10, 20 and 12, 22 are installed so that these supply lines are divided among the respective groups, so that there is no supply of control signals from one group to another group in accordance with the data input-output configuration. In this respect, the configuration differs from conventional examples.

In the case of the 16-bit data input-output configuration, the data input-output terminals DQ0 to DQ7 and DQ8 to DQ15 installed on the chip 1 are all in use. In order to facilitate understanding, the terminals and circuits that are in use are indicated by double lines in the figures. Furthermore, all of the data input-output terminals DQ0 to DQ7 and DQ8 to DQ15 installed on the chip 1 are connected to all of the corresponding data input-output pins P0 to P7 and P8 to P15 installed in the package via bonding wires 3. Moreover, the control signal terminals STB0 and STB1 and MSK0 and MSK1 of the first and second groups are also connected to the control signal pins PS0 and PS1 and PM0 and PM1 via bonding wires 3.

Thus, in the case of he 16-bit data input-output configuration shown in FIG. 4, the input and output of 2 bytes (8 bits×2) of data are controlled by the control signals STB and MSK belonging to the respective groups I and II. The strobe signal STB0 in the first group I controls the activation timing of the 8 data input-output buffers IO-BUF0 to IO-BUF7 in the first group, and the strobe signal STB1 in the second group II controls the activation timing of the 8 data input-output buffers IO-BUF8 to IO-BUF15 in the second group. The circuits of the data input-output buffers will be described later. However, in cases where the memory chip outputs strobe signals, these strobe signals are not supplied to the data output buffers, but are output from the control signal terminal STB0 as signals that indicate the timing of data output from the data output buffers.

Similarly, the mask signal MSK0 in the first group I controls the inactivation timing of the 8 (at least 8; may also be 16 or 32) write amplifiers WA0 to WA7 that correspond to the first group. Likewise, the mask signal MSK1 in the second group II controls the inactivation timing of the 8 write amplifiers WA8 to WA15 that correspond to the first group.

FIG. 5 shows a memory device with an 8-bit (1-byte) data input-output configuration. In the figure, the double frames indicate terminals and input-output buffers that are in use. In the case of this 8-bit data input-output configuration, four of the terminals DQ0, DQ2, DQ5 and DQ7 among the data input-output terminals in the first group I are used, and four of the terminals DQ8, DQ10, DQ13 and DQ15 among the data input-output terminals in the second group II are used. Accordingly, bonding wires 3 are installed for the terminals that are used. Furthermore, the external pins P1, P3, P4, P6, P9, P11, P12 and P14 are designated as unused pins. However, boding wires 3 that connect unused terminals and unused pins may also be installed.

The 8 data input-output buffers IO-BUF0, IO-BUF2, IO-BUF5, I-BUF7 and IO-BUF8, IO-BUF10, IO-BUF13, IO-BUF15 are controlled by the strobe signals STB0 and STB1 in the respective groups. In other words, the data input-output signals consisting of 8 bits are separately controlled by the strobe signals STB0 and STB1, with 4 bits being controlled by each strobe signal.

Accordingly, the strobe signals STB0 and STB1 from the outside are supplied to the data input-output buffers in the respective groups. Furthermore, in cases where the memory chip outputs strobe signals, the respective strobe signals STB0 and STB1 are output from the output terminals in correspondence with the data output buffers in the respective groups.

The data input-output buffers IO-BUF1, IO-BUF3, IO-BUF4, IO-BUF6 and IO-BUF9, IO-BUF11, IO-BUF12, IO-BUF14 corresponding to the unused data input-output terminals DQ1, DQ3, DQ4, DQ6 and DQ9, DQ11, DQ12, DQ14 are controlled to an unused state by the data configuration control signals L4, L8 and L16. As will be clear from the concrete circuit described later, the data input-output buffers in an unused state are inactivated by the data configuration control signals, so that these buffers are not activated even if strobe signals are supplied.

Furthermore, the four write amplifiers WA selected by the column addresses Add among the 8 write amplifiers WA corresponding to each group transmit the 4 bits of data input in each group to a memory cell array (not shown in the figures) via data busses DB and /DB. Moreover, four write amplifiers among the write amplifiers WA corresponding to the first group I are inactivated by the mask signal MSK0 in the first group. Similarly, four write amplifiers among the write amplifiers WA corresponding to the second group II are inactivated by the mask signal MSK1 in the second group. In other words, 8 bits of data are separately controlled by two mask signals MSK0 and MSK1 so that writing is prohibited, with 4 bits being controlled by each mask signal.

FIG. 6 shows a memory device with a 4-bit (½-byte) data input-output configuration. In the figure, double frames indicate terminals and input-output buffers that are in use. In the case of this 4-bit data input-output configuration, two of the terminals DQ2 and DQ5 among the data input-output terminals in the first group are used, and two terminals DQ10 and DQ13 among the data input-output terminals in the second group are used. Accordingly, bonding wires 3 are installed for the terminals that are used. Furthermore, the external pins P0, P1, P3, P4, P6, P7, P8, P9, P11, P12, P14 and P15 are designated as unused pins. However, bonding wires 3 that connect unused terminals and unused pins may also be installed.

The four data input-output buffers IO-BUF2 and IO-BUF5 and IO-BUFL0 and IO-BUF13 are controlled by the strobe signals STB0 and STB1 in the respective groups. In other words, the data input-output signals consisting of 4 bits are separately controlled by the strobe signals STB0 and STB1, with 2 bits being controlled by each strobe signal.

Accordingly, strobe signals STB0 and STB1 from the outside are supplied to the data input-output buffers in the respective groups. Furthermore, in cases where the memory chip outputs strobe signals, the respective strobe signals STB0 and STB1 are output from output terminals in corresponding to the data input-output buffers in the respective groups.

The data input-output buffers IO-BUF0, IO-BUF1, IO-BUF3, IO-BUF4, IO-BUF6, IO-BUF7 and IO-BUF8, IO-BUF9, IO-BUF11, IO-BUF12, IO-BUF14, IO-BUF15 corresponding to the unused data input-output terminals DQ0, DQ1, DQ3, DQ4, DQ6, DQ7 and DQ8, DQ9, DQ11, DQ12, DQ14, DQ15 are controlled to an unused state by the data configuration control signals L4, L8 and L16. As will be clear from the concrete circuit described later, the data input-output buffers in an unused state are inactivated by the data configuration control signals, so that these buffers are not activated even if strobe signals are supplied.

Furthermore, the two write amplifiers WA selected by the two bits of column addresses Add among the 8 write amplifiers WA corresponding to each group transmit the 2 bits of data input in each group to a memory cell array (not shown in the figures) via data busses DB and /DB. Moreover, two write amplifiers among the write amplifiers WA corresponding to the first group are inactivated by the mask signal MSK0 in the first group. Similarly, two write amplifiers among the write amplifiers WA corresponding to the second group are inactivated by the mask signal MSK1 in the second group. In other words, 4 bits of data are separately controlled by two mask signals MSK0 and MSK1 so that writing is prohibited, with 2 bits being controlled by each mask signal.

As is clear from FIGS. 4, 5 and 6, the control of the data input-output buffers and write amplifiers (write circuits)

with respect to the data input-output signals of the first group I is always performed by the control signals STB0 and MSK0 in the first group I regardless of the data input-output configuration. Furthermore, the control of the data input-output buffers and write amplifiers with respect to the data input-output signals of the second group II is likewise always performed by the control signals STB1 and MSK1 in the second group II regardless of the data input-output configuration.

Accordingly, the control signal supply lines 10, 20 and 12, 22 are fixed regardless of the data input-output configuration, so that skewing of the control signals that occurs in cases where the control signals in the second group are supplied to the controlled circuits in the first group as in conventional examples can be suppressed. Furthermore, there is no need to install switching circuits in the control signal supply lines so that complicated control is not necessarily performed by means of data configuration control signals L4, L8 and L16. In addition, since the control signal terminals of the respective groups are always in use regardless of the data input-output configuration, the external memory controller does not have to consider which control signal terminals are to be provided in accordance with the data input-output configuration, so that control of the supply of control signals is simplified.

Figure 7:
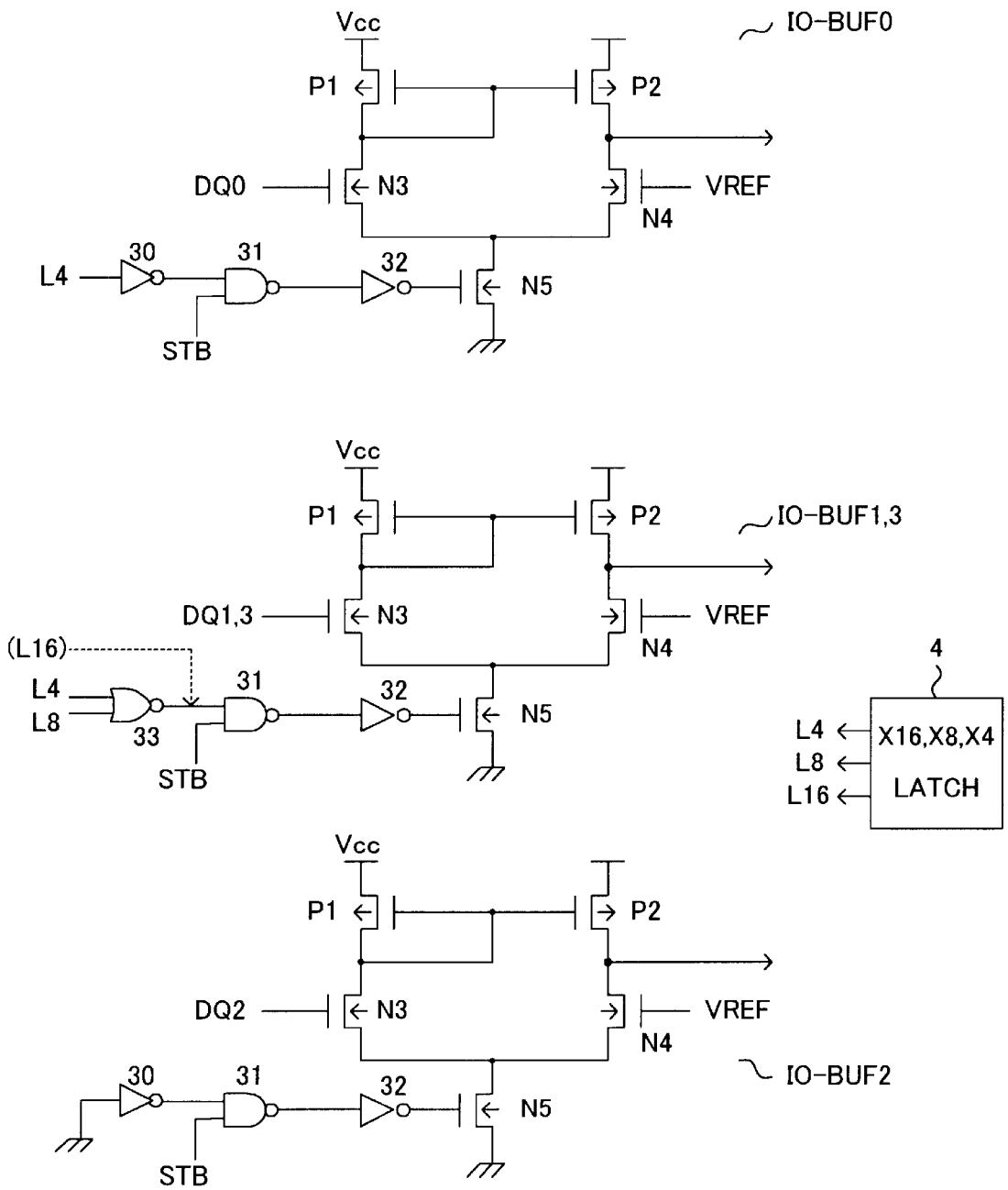
FIG. 7 shows concrete circuit diagrams of data input-output buffers.

FIG. 7 shows examples of concrete circuit diagrams of data input-output buffers. In FIG. 7, four data input-output buffers IO-BUF0 to IO-BUF3 are shown as typical examples of the 16 data input-output buffers IO-BUF0 to IO-BUF15. However, since the data input-output buffers IO-BUF1 and IO-BUF3 have the same circuit construction, three types of data input-output buffers are shown in FIG. 7. Furthermore, only the input buffer circuits of the data input-output buffers are shown in FIG. 7.

All of the data input-output buffers are constructed from P-channel transistors P1 and P2 that form a current mirror circuit, N-channel transistors N3 and N4 in which a data input signal DQ and a reference voltage Vref are respectively applied to the gates of the transistors, and a current supply transistor N5. When the current supply transistor N5 is in a conductive state, the buffer is activated, and detects whether the data input signal DQ is higher or lower than the reference voltage Vref.

The data input-output buffer IO-BUF0 is in an unused state in the case of a 4-bit data input-output configuration. Furthermore, this buffer is in a used state in the case of an 8-bit or 16-bit data input-output configuration, and is activated in synchronization with the strobe signal STB. For this purpose, inverters 30 and 32 and a NAND gate 31 are installed, and when the data configuration control signal L4 that controls a 4-bit data input-output configuration is at the H level, the transistor N5 is placed in a non-conductive state in spite of the fact that the strobe signal STB is at the H level. On the other hand, when the data configuration control signal L4 is at the L level, the transistor N5 is placed in a conductive state in the case of the H level of the strobe signal STB, so that the data input-output buffer IO-BUF0 is activated.

The data input signals DQ1 and DQ3 are respectively supplied to the data input-output buffers IO-BUF1 and IO-BUF3; these buffers are in an unused state in the case of a 4-bit or 8-bit data input-output configuration, and are used in the case of a 16-bit data input-output configuration. Accordingly, when the 4-bit or 8-bit data configuration control signal L4 or L8 is applied to the NOR gate 33, and one of the data configuration control signals L4 or L8 is at the H level, the transistor N5 is placed in a non-conductive state in spite of the fact that the strobe signal STB is at the H level. In cases where both of the data configuration control signals L4 and L8 are at the L level, the transistor N5 is place in a conductive state in response to the H level of the strobe signal STB.

As another example of the construction of the data input-output buffers IO-BUF1 and IO-BUF3, it would also be possible to supply the 16-bit data configuration control signal L16 directly to the NAND gate 31 as indicated by the broken line. In this case, when the data configuration control signal L16 is at the H level, the transistor N5 is placed in a conductive state in response to the H level of the strobe signal STB, so that the data input-output buffer is activated.

In the data input-output buffer IO-BUF2, the input of the inverter 30 is always connected to the ground and thus maintained at the L level; accordingly, this buffer is always controlled to a state of use regardless of the data configuration, and is therefore activated in response to the strobe signal STB.

The other data input-output buffers IO-BUF4 to IO-BUF7, IO-BUF8 to IO-BUF11 and IO-BUF12 to IO-BUF15 also have configurations that are similar to those of the abovementioned data input-output buffers IO-BUF0 to IO-BUF3. Furthermore, in the data configuration control signal generating circuit 4 that generates the data configuration control signals L4, L8 and L16, signals that set the data configuration are loaded from a register (not shown in the figures) and latched inside when the power supply starts up for example.

In FIGS. 4, 5 and 6, strobe signals in the respective groups also control data output buffers in the same groups in cases where the operational timing of the data output buffers is controlled by strobe signals. This control is the same even if the data output configuration is different. Such strobe signals that control the data output timing may be supplied from an external memory controller, or may be output from the memory circuit itself. In cases where the strobe signals are supplied from an external memory controller, the strobe signals are supplied to the data output buffers in the respective groups via strobe signal supply lines installed in the respective groups. On the other hand, in cases where the strobe signals are supplied from the memory circuit, the strobe signals in the respective groups are output in accordance with the output timing of the data output buffers in the respective groups, and are not supplied to the data output buffers.

However, the data output buffers are appropriately controlled to an active state or inactive state by data output configuration signals L4, L8, L16 that control the data output configuration.

Figure 8:
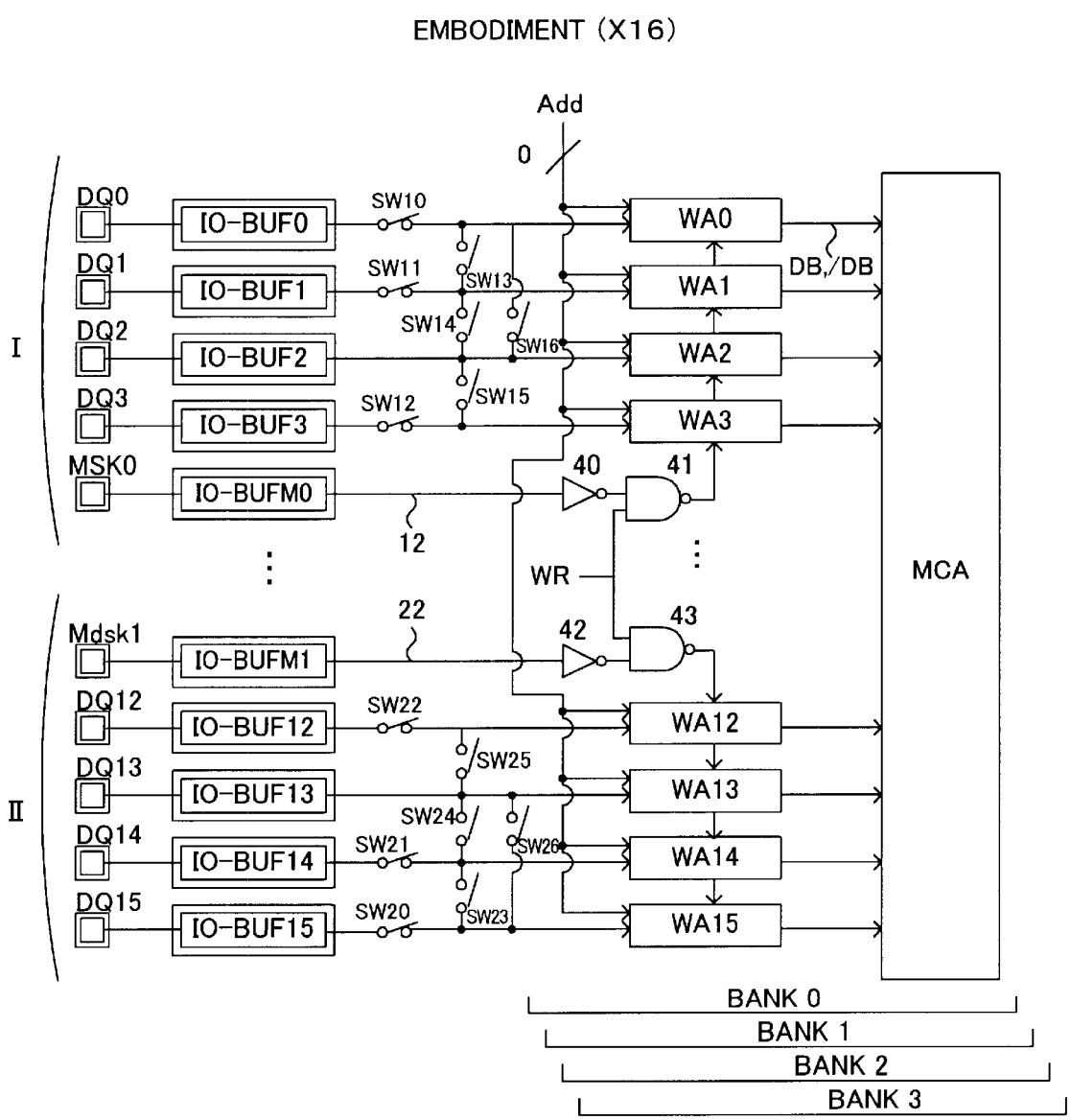
FIG. 8 is a diagram which shows the relationship between the mask signals and the write circuits in the present embodiment.
Figure 9:
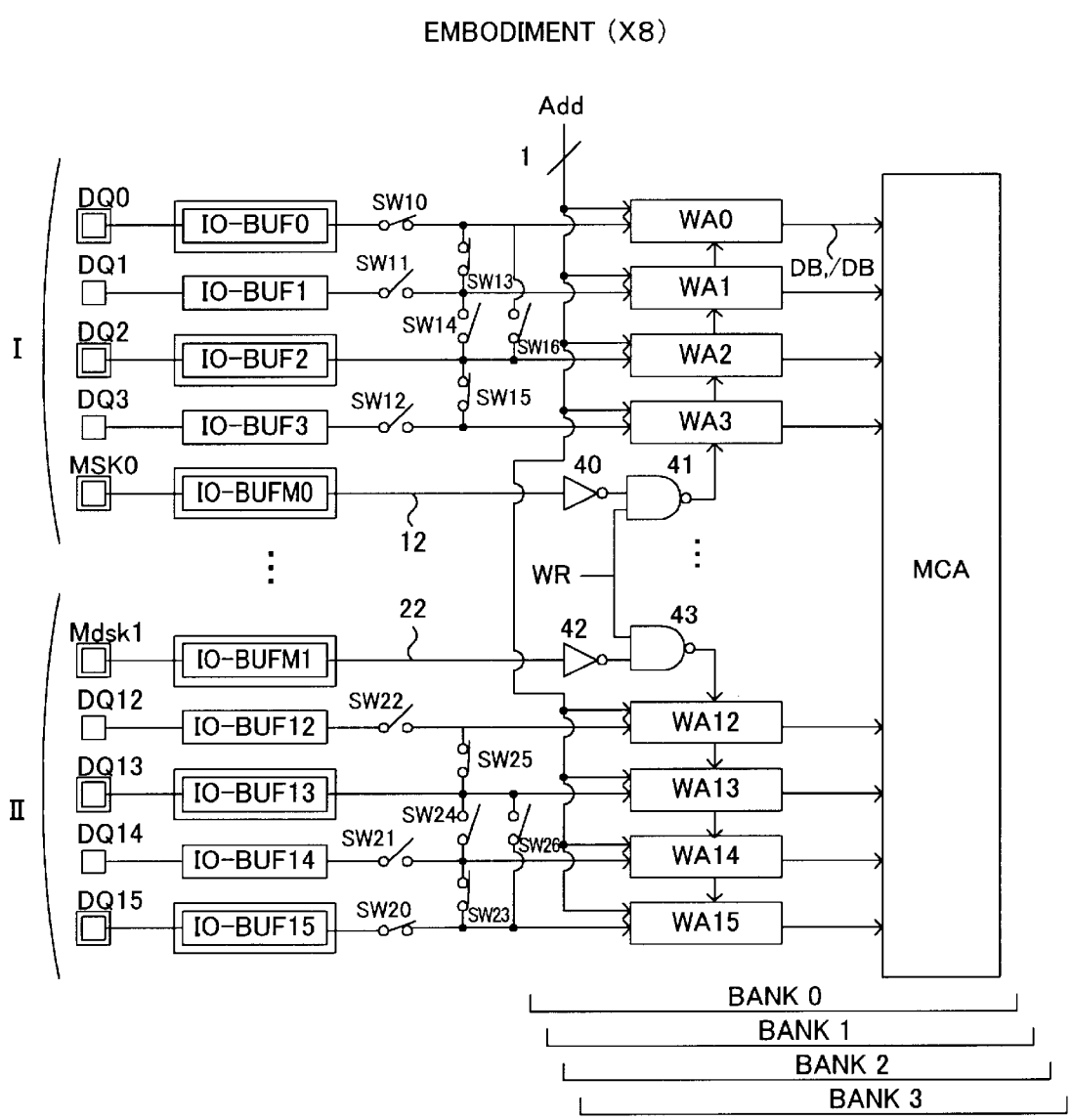
FIG. 9 is a diagram which shows the relationship between the mask signals and the write circuits in the present embodiment.
Figure 10:
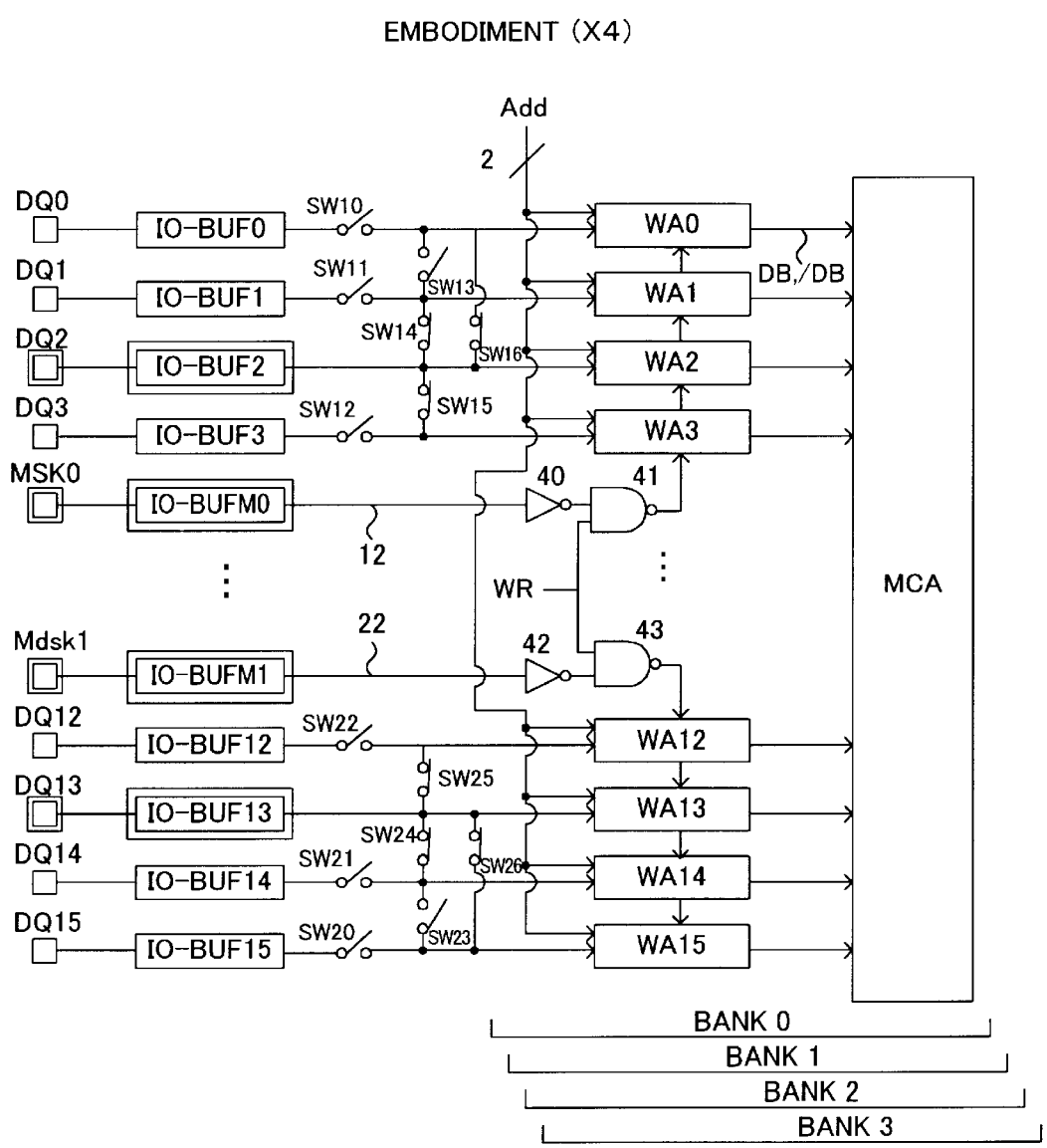
FIG. 10 is a diagram which shows the relationship between the mask signals and the write circuits in the present embodiment.

FIGS. 8, 9 and 10 are diagrams which show the relationship between the mask signals and write circuits in the present embodiment. FIG. 8 shows an example of a 16-bit data input-output configuration, FIG. 9 shows an example of an 8-bit data input-output configuration, and FIG. 10 shows an example of a 4-bit data input-output configuration.

To describe the configuration with reference to FIG. 8, the 4-bit data input-output terminals DQ0 to DQ3 and the corresponding mask signal terminal MSK0 are shown from among the first group of data input-output terminals I, which has 8-bit data input-output terminals. Furthermore, the 4-bit data input-output terminals DQ12–15 and the corresponding mask signal terminal MSK1 are shown from among the second group of data input-output terminals II. Accordingly, in the first group I, the data input-output buffers IO-BUF0 to IO-BUF3 and mask signal input buffer IO-BUFM0 are shown, and in the second group II, the data input-output buffers IO-BUF12 to IO-BUF15 and mask signal input buffer IO-BUFM1 are shown.

The outputs of the data input-output buffers (precisely input buffers) are supplied to the write amplifiers WA in memory banks BANK0 to BANK3, and the write amplifiers WA transfer the write data to a memory cell array MCA via data busses DB and /DB. Eight write amplifiers WA0 to WA7 are installed in the memory banks BANK0 to BANK3 for the 8-bit data input signals DQ0 to DQ7 in the first group. However, only four write amplifiers WA0 to WA3 are shown in the figure. Likewise, eight write amplifiers WA8 to WA15 are installed in the memory banks BANK0 to BANK3 for the 8-bit data input signals DQ8 to DQ15 in the second group. Similarly, however, only four write amplifiers WA12 to WA15 are shown in the figure.

Switches SW10 to SW16 whose switching is controlled in accordance with the data input-output configuration are installed between the data input-output buffers and write amplifiers of the first group I. Similarly, switches SW20 to SW26 are installed between the data input-output buffers and write amplifiers of the second group II. The conductive and non-conductive states of these switches are appropriately controlled by the data configuration control signals L4, L8 and L16.

In the case of the 16-bit configuration shown in FIG. 8, the outputs of the eight data input-output buffers IO-BUF0 to IO-BUF7 and IO-BUF8 to IO-BUF15 of each of the groups I and II are connected "as is" to the eight write amplifiers WA0 to WA7 and WA8 to WA15 respectively installed in the memory banks. Accordingly, in the first group I, the switches SW10, SW11 and SW12 are controlled to a conductive state, and the remaining switches SW13 to SW16 are controlled to a non-conductive state. Furthermore, in the second group II as well, the switches SW20, SW21 and SW22 are controlled to a conductive state, and the remaining switches SW23 to SW26 are controlled to a non-conductive state.

Furthermore, in the first group I, the mask signal MSK0 controls the write amplifiers WA0 to WA7 in the first group via the mask signal supply line 12. In concrete terms, the mask signal MSK0 is supplied to the eight write amplifiers WA0 to WA7 via an inverter 40 and NAND gate 41. A write control signal WR is input into the NAND gate 41, and when the mask signal MSK0 is at the L level, the eight write amplifiers WA0 to WA7 all operate at the same time in response to the write control signal WR. Furthermore, in cycle in which the mask signal MSK0 is at the H level, the operation of the eight write amplifiers WA0 to WA7 is maintained in an inactive state regardless of the write control signal WR.

Similarly, in the second group II as well, the mask signal MSK1 controls the write amplifiers WA8 to WA15 via the mask signal supply line 22. This control is the same as in the case of the first group.

The eight write amplifiers WA0 to WA7 corresponding to the first group I receive the mask control signal MSK0 in the same group via the mask control signal supply line 12, and are controlled by this signal. Similarly, the eight write amplifiers WA8 to WA15 corresponding to the second group II receive the mask control signal MSK1 in the same group via the mask control signal supply line 22, and are controlled by this signal.

FIG. 9 shows a memory circuit with an 8-bit configuration; here, in each of groups I and II, 4-bit data input-output terminals are used. The double lines in the figure respectively indicate the data input-output terminals DQ and data input-output buffers IO-BUF that are in use.

Among the switches installed between the data input-output buffers and write amplifiers, the switches SW10, SW13 and SW15 are controlled to a conductive state in the first group I, while the remaining switches SW11, SW12, SW14 and SW16 in this group are controlled to a non-conductive state. In the second group II, the switches SW20, SW23 and SW25 are controlled to a conductive state, while the remaining switches SW21, SW22, SW24 and SW26 are controlled to a non-conductive state. As a result, the data input signal DQ0 is supplied to the write amplifiers WA0 and WA1, and is transferred to the memory cell array MCA by the write amplifier selected by the address Add. Furthermore, the data input signal DQ2 is supplied to the write amplifiers WA2 and WA3, and the write amplifier that is used is selected by the address Add. Similarly, the data input signal DQ13 is respectively supplied to the write amplifiers WA12 and WA13, and the data input signal DQ15 is respectively supplied to the write amplifiers WA14 and WA15; the write amplifiers WA that are used are then selected by the address Add.

Various methods may be used for the operation of the write amplifiers. For example, such methods include a method in which the 4 bits of data in each group are simultaneously written by the four write amplifiers, and a method in which the 4 bits of data in each group are supplied to eight write amplifiers over a period of two cycles, so that 8 bits of data are simultaneously written.

In the 8-bit configuration shown in FIG. 9 as well, the write amplifiers in the first group I receive the mask signal MSK0 in the same group via the mask signal supply line 12, and the write amplifiers in the second group II receive the mask signal MSK1 in the same group via the mask signal supply line 22. The mask signal in one group is not supplied to the write amplifiers in the other group as in conventional examples. Accordingly, the mask signal supply lines are simplified, and the occurrence of a large skewing in the mask signals supplied to the write amplifiers can be suppressed.

FIG. 10 shows a memory circuit with a 4-bit configuration; here, in the respective groups I and II, 2-bit data input-output terminals each are in a state of use. The double lines in the figure respectively indicates the data input-output terminals DQ and data input-output buffers IO-BUF that are used. The construction of the write amplifiers in the memory banks is the same as in FIGS. 8 and 9.

Here, among the switches installed between the data input-output buffers and write amplifiers, the switches SW14, SW15 and SW16 in the first group I are controlled to a conductive state, while the remaining switches in this group are controlled to a non-conductive state. In the second group II, the switches SW24, SW25 and SW26 are controlled to a conductive state, while the remaining switches are controlled to a non-conductive state. As a result, in the first group I, the data input signal DQ2 is supplied to four write amplifiers WA0 to WA3, and the write amplifier WA that is used is selected by the address Add, so that the data input signal is transferred to the memory cell array MCA. Furthermore, in the second group II, the data input signal DQ13 is supplied to four write amplifiers WA12 to WA15, and the write amplifier WA that is used is selected by the address Add.

In the 4-bit configuration shown in FIG. 10 as well, write amplifiers WA0 to WA7 in the first group I receive the mask signal MSK0 in the same group via the mask signal supply line 12, and the write amplifiers WA8 to WA15 in the second group II receive the mask signal MSK1 in the same group via the mask signal supply line 22. The mask signal of one group is not supplied to the write amplifiers of the other group as in conventional examples.

Thus, the switches between the data input-output buffers and the write amplifiers are controlled in accordance with the data input-output configuration; however, the mask signal supply lines 12 and 22 that are provided for the write amplifiers in the respective groups are the same regardless of the data input-output configuration. Furthermore, the addresses Add that select the write amplifiers are controlled in accordance with the data input-output configuration so that either all of the write amplifiers are selected (16-bit configuration), four write amplifiers are selected in each group (8-bit configuration), or two write amplifiers are selected in each group (4-bit configuration).

Furthermore, in FIGS. 8, 9 and 10, the inverters 40 and 42 and NAND gates 41 and 43 may also be installed for each of the write amplifiers. Moreover, it would also be possible to install 16 or 32 write amplifiers corresponding to each group. In such a case, the write amplifiers are appropriately selected by addresses, and a number of write amplifiers corresponding to the number of data input-output terminals in use in each group operate simultaneously.

Figure 11:
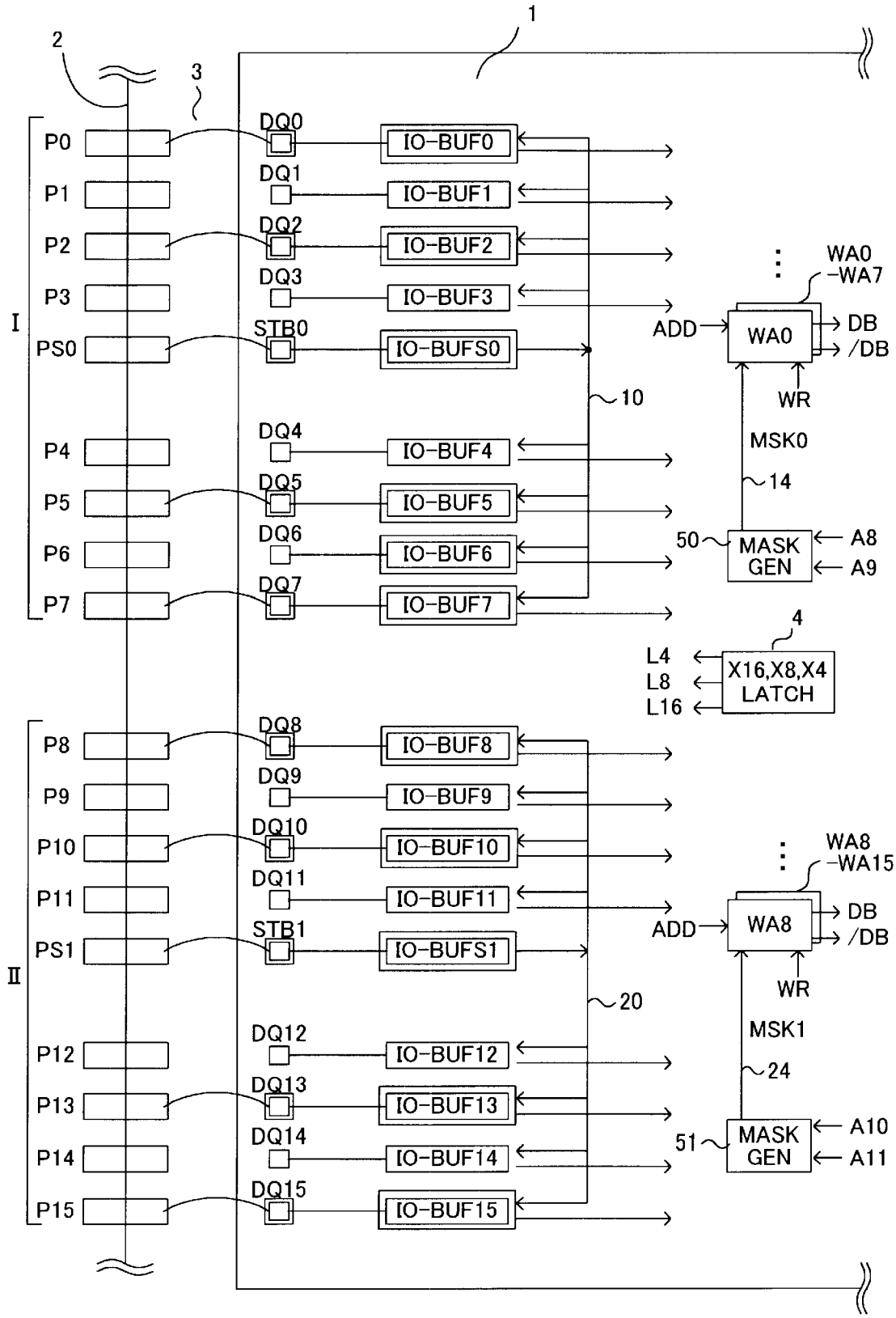
FIG. 11 is a diagram which shows the construction of a memory device in a second embodiment of the present invention.

FIG. 11 shows the construction of the memory device in a second embodiment of the present invention. This embodiment is an example of a 8-bit data configuration, and corresponds to FIG. 5. In this second embodiment, variable writing is used instead of a write mask operation utilizing mask signals. In the case of variable writing, commands designating burst writing are given initially along with information concerning cycles in which writing is to be masked, and the writing operation is prohibited in designated cycles within this burst writing.

For this purpose, information concerning cycles in which writing is to be masked is supplied from the external memory controller via address terminals A8, A9, A10 and A11. Inside the memory chip 1, mask signal generating circuits 50 and 51 which respectively generate mask signals MSK0 and MSK1 in response to the abovementioned information concerning cycles in which writing is to be masked are installed for the respective groups I and II.

In regard to the addresses, row addresses and column addresses are serially supplied by interleaving; ordinarily, however, the number of column addresses is smaller than the number of row addresses. Accordingly, 2 bits of write mask cycle information is supplied to each of the address terminals A8, A9 and A10, A11 not used for column addresses. Mask signals MSK0 and MSK1 are generated by the respective mask signal generating circuits 50 and 51 in the designated cycles that are to be masked in accordance with the abovementioned information.

In cases where the variable writing operation shown in FIG. 11 is performed, the mask signal MSK0 is also supplied to the write amplifiers in the first group I from the mask signal generating circuit 50 in the same group I via the mask signal supply line 14; similarly, the mask signal MSK1 is supplied to the write amplifiers in the second group II from the mask signal generating circuit 51 in the same group II via the mask signal supply line 24. Furthermore, the supply of these mask signals is common to all data input-output terminal configurations, i.e., 16-bit, 8-bit and 4-bit configurations, with mask signals in each group being separately supplied to the write amplifiers in the same group.

Accordingly, in cases where the write masks for all of the bits are controlled in the same manner in the 8-bit or 4-bit configuration, the same cycle information is given in the addresses A8 and A9 of the first group and the addresses A10 and A11 of the second group. Of course, it would also be possible to control the system so that writing is masked in different cycles in the first and second groups.

In the abovementioned a method in which the write amplifiers are inactivated by supplying mask signals to the mask terminals at the timing of write mask, the write operating cycle is short in the case of operation in the high-frequency region, so that it may be predicted that mask control by the mask signals supplied in the same cycle will be difficult. The variable writing operation allows the secure masking of writing even in such a high-frequency region. In variable writing, information concerning the cycles in which writing is to be masked is supplied beforehand together with the initial command for burst writing, and the writing operation in the designated cycles is prohibited in subsequent burst writing operations. For example, if "3" is designated by the addresses A8 and A9 in the case of a burst length of 4, the writing operation of the third cycle is prohibited.

In the abovementioned embodiment, two data input-output terminal groups consisting of eight data input-output terminals each are installed on the chip, and control signal terminals are provided for each group so that control can be performed in byte units. However, the present invention is not limited to such a configuration. FIG. 12 shows other examples of configuration of data input-output terminal groups. In these examples, four data input-output terminal groups I, II, III and IV, each consisting of eight data input-output terminals, are installed on the chip 1.

Figure 12A:
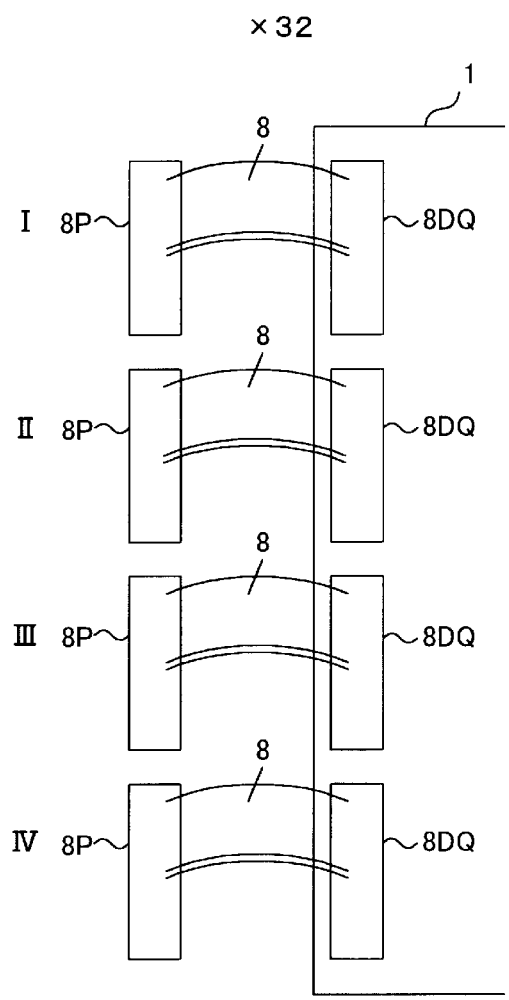
FIG. 12 is a diagram which shows other examples of the construction of a data input-output terminal group.

Furthermore, in the example shown in FIG. 12A, the data input-output configuration is a 32-bit data input-output configuration, with all of the data input-output terminals being used. In the first group I, the eight data input-output terminals on the chip and the eight external pins of the package are connected by eight bonding wires; among these, furthermore, a strobe signal terminal and a mask signal terminal are also similarly connected. The second group II, third group III and fourth group IV also have a similar configuration. In other words, each group forms data input-output terminals for 1 byte (1 word), and the inputs or outputs of these data input-output terminals are controlled by control signals belonging to the respective groups.

Figure 12B:
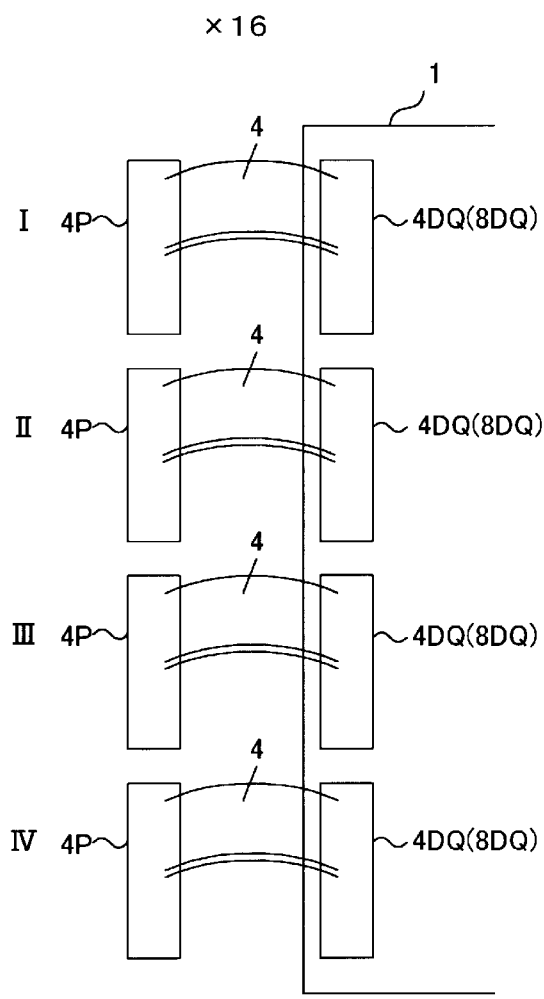

In the example shown in FIG. 12B, the data input-output configuration is a 16-bit data input-output configuration, with four data input-output terminals being used in each group. Accordingly, 1 byte (1 word) is formed by the eight data input-output terminals obtained by combining the first group I and second group II, and another single byte (1 word) is formed by the eight data input-output terminals obtained by combining the third group III and fourth group IV. However, the strobe signals and mask signals provided for the respective groups are separately supplied to the data input-output buffers and write amplifiers in the respective groups.

Depending on the configuration of the system in which the memory device is mounted, there may be cases in which input-output and writing operations are controlled in 16-bit units. In such cases, the respective groups have 16-bit data input-output terminals, and these data input-output terminals are separately controlled by control signals within the same group.

Thus, in the present invention, control signal terminals provided for respective data input (or output) terminal groups which have N-bit data input (or output) terminals are always in a state of use regardless of the data input (or output) configuration, so that respective control signals are separately supplied to controlled circuits within the same groups as the control signals. Accordingly, control signals are supplied to controlled circuits in the same groups as the control signals regardless of the data input (output) configuration, so that the skewing of control signals can be suppressed. Furthermore, the structure of the control signal supply lines is simplified, and the supply of control signals from the outside is the same regardless of the data input (or output) configuration, so that this supply is also simplified.

What is claimed is:

1. A memory circuit which may select one of a plurality of different data input-output configurations, comprising:

M (M is a plurality) data input-output terminal groups, each of which has N (N is a plurality) data input-output terminals;

M control signal terminals each for controlling data input to or output from corresponding said data input-output terminal group;

M sets of N controlled circuits each set for controlling data input or output signals provided for corresponding said data input-output terminal group; and M sets of control signal supply lines coupled with said M sets of control signal terminal groups, each set of which supply control signals exclusively to said N controlled circuits in corresponding to said data input-output terminal group;

wherein the data input-output configuration is controlled to a first data input-output configuration in which a controlled data unit having a specified number of bits is formed by a single data input-output terminal group, or to a second data input-output configuration in which said controlled data unit is formed by a plurality of data input-output terminal groups, in accordance with a data configuration control signal that controls use or non-use of the data input-output terminals, and control signals belonging to each of said data input-output terminal groups are supplied exclusively to the controlled circuits of the data input-output terminal groups respectively, regardless of said first or second data input-output configuration.

2. The memory circuit according to claim 1, wherein said control signal terminals belonging to said respective data input-output terminal groups are used in either of said first or second data input-output configurations.

3. The memory circuit according to claim 1, wherein said control signals include strobe signals that control a timing of an input (or output) of data signals, and said controlled circuits include data input circuits (or data output circuits) that are connected to said data input-output terminals.

4. The memory circuit according to claim 1, wherein said control signals include mask signals that control a masking of an input (or output) of data signals.

5. The memory circuit according to claim 4, wherein said controlled circuits include write circuits that transmit said data signals to an internal memory cell array (or read-out circuits that transmit said data signals from said memory cell array).

6. The memory circuit according to any of claims 1 through 4, wherein said controlled data unit with the specified number of bits is a word unit, and said controlled circuits are controlled by control signals belonging to the respective data input-output terminal groups, both in cases where said controlled data unit having the word unit is formed by a single data input-output terminal group, and in cases where said controlled data unit is formed by said plurality of data input-output terminal groups.

7. The memory circuit according to claim 6, wherein said N is the number of bits that form one word.

8. A memory circuit which can select one of a plurality of different data input configurations, comprising:

M (M is a plurality) data input terminal groups, each of which has N (N is a plurality) data input terminals;

M strobe signal terminals each for controlling data input from corresponding said data input terminal group;

M sets of data input buffers, each provided for each of said data input terminal groups, for respectively inputting data input signals; and M sets of strobe signal supply lines, each provided for each of said data input terminal groups, for supplying said strobe signals within the groups to said data input buffers;

wherein the data input configuration is controlled to a first data input configuration in which a controlled data unit having a specified number of bits is formed by a single data input terminal group, or to a second data input configuration in which said controlled data unit is formed by a plurality of data input terminal groups, in accordance with a data configuration control signal that controls use or non-use of the data input terminals; and wherein strobe signals belonging to each of said data input terminal groups are supplied exclusively to the data input buffers of the data input terminal groups respectively, regardless of said first or said second data input configuration.

9. The memory circuit according to claim 8, wherein a part of said data input buffers is controlled to an inactive state in accordance with said data configuration control signal in the case of said second data input configuration.

10. The memory circuit according to claim 8, wherein said strobe signal terminals belonging to the respective data input terminal groups are used in both said first and said second data input configurations.

11. A memory circuit which can select one of a plurality of different data output configurations, comprising:

M (M is a plurality) data output terminal groups, each of which has N (N is a plurality) data output terminals;

M strobe signal terminals each for controlling data output to corresponding said data output terminal group; and M sets of data output buffers, each provided for each of said data output terminal groups, for respectively outputting data output signals;

wherein the data output configuration is controlled to a first data output configuration in which a controlled data unit having a specified number of bits is formed by a single data output terminal group, or to a second data output configuration in which said controlled data unit is formed by a plurality of data output terminal groups, in accordance with a data configuration control signal that controls use or non-use of the data output terminals; and wherein strobe signals belonging to each of said data output terminal groups are supplied exclusively to the data output buffers of the data output terminal groups, regardless of said first or said second data output configuration.

12. The memory device according to claim 11, wherein a part of said data output buffers is controlled to an inactive state in accordance with said data configuration control signal in the case of said second data output configuration.

13. The memory device according to claim 12, wherein said strobe signal terminals belonging to the respective data output terminal groups are used in both said first and said second data output configurations.

14. A memory circuit which can select one of a plurality of different data input configurations, comprising:

M (M is a plurality) data input terminal groups, each of which has N (N is a plurality) data input terminals;

M mask signal terminals, each provided for each of said data input terminal groups, for controlling a prohibition of a writing operation;

M sets of write circuits, each provided for each of said data input terminal groups, for respectively transferring said data input signals to a memory cell array; and M sets of mask signal supply lines, each provided for each of said data input terminal groups, for supplying said mask signals within the groups to said write circuits;

wherein the data input configuration is controlled to a first data input configuration in which a controlled data unit having a specified number of bits is formed by a single data input terminal group, or to a second data input configuration in which said controlled data unit is formed by a plurality of data input terminal groups, in accordance with a data configuration control signal that controls use or non-use of the data input terminals; and wherein mask signals belonging to each of said data input terminal groups are supplied exclusively to the write circuits of the data input terminal groups, regardless of said first or said second data input configuration.

15. The memory circuit according to claim 14, wherein said mask signal terminals belonging to the respective input terminal groups are used in both said first and said second data input configurations.

16. A memory circuit which can select one of a plurality of different data input configurations, comprising:

M (M is a plurality) data input terminal groups, each of which has N (N is a plurality) data input terminals;

M mask information input terminals, each provided for each of said data input terminal groups, for designating cycle in which the writing operation is to be prohibited;

M sets of mask signal generating circuits, each provided for each of said data input terminal groups, for generating mask signal in the designated cycle in accordance with said mask information;

M sets of write circuits, each provided for each of said data input terminal groups, for respectively transferring said data input signals to a memory cell array; and M sets of mask signal supply lines, each provided for each of said data input terminal groups, for supplying said mask signals within the groups to said write circuits;

wherein the data input configuration is controlled to a first data input configuration in which a controlled data unit having a specified number of bits is formed by a single data input terminal group, or to a second data input configuration in which said controlled data unit is formed by a plurality of data input terminal groups, in accordance with a data configuration control signal that controls use or non-use of the data input terminals; and wherein mask signals belonging to each of said data input terminal group are supplied exclusively to the write circuits of the data input terminal groups, regardless of said first or said second data input configuration.

17. The memory circuit according to claim 16, wherein said mask information input terminals belonging to the respective data input terminal groups are used in both said first and said second data input configurations.

18. The memory circuit according to claim 16, wherein said mask information input terminals are formed by a part of the address signal terminals.

19. A memory circuit which may select one of a plurality of different data input-output configurations, comprising:

M (M is a plurality) data input-output terminal groups, each of which has N (N is a plurality) data input-output terminals;

M control signal terminals each for controlling data input to or output from corresponding said data input-output terminal group;

M sets of N controlled circuits each set for controlling data input or output signals provided for corresponding said data input-output terminal group; and M sets of control signal supply lines coupled with said M sets of control signal terminal groups, each set of which supply control signals exclusively to said N controlled circuits in corresponding to said data input-output terminal group, regardless of selected data input-output configuration.

\* \* \* \* \*